(12) United States Patent
Zeng et al.

(10) Patent No.: US 11,909,353 B2
(45) Date of Patent: *Feb. 20, 2024

(54) GROUND-FAULT DETECTING DEVICE AND RELATED METHOD

(71) Applicant: KEHUA HENGSHENG CO., LTD., Xiamen Fujian (CN)

(72) Inventors: Chunbao Zeng, Xiamen Fujian (CN); Peizai Hong, Xiamen Fujian (CN); Wen Wei, Xiamen Fujian (CN); Zhenhuang Lin, Xiamen Fujian (CN); Kailong Chen, Xiamen Fujian (CN)

(73) Assignee: KEHUA HENGSHENG CO., LTD., Xiamen Fujian (CN)

( * ) Notice: Subject to any disclaimer, the term of this patent is extended or adjusted under 35 U.S.C. 154(b) by 0 days.

This patent is subject to a terminal disclaimer.

(21) Appl. No.: 17/940,743

(22) Filed: Sep. 8, 2022

(65) Prior Publication Data

US 2023/0006605 A1 Jan. 5, 2023

Related U.S. Application Data

(63) Continuation of application No. 16/556,230, filed on Aug. 30, 2019, now Pat. No. 11,469,708.

(51) Int. Cl.
*H02S 50/00* (2014.01)
*G01R 31/50* (2020.01)
(Continued)

(52) U.S. Cl.
CPC .............. *H02S 50/00* (2013.01); *G01R 31/50* (2020.01); *H02J 3/0012* (2020.01); *H02J 3/381* (2013.01); *H02J 3/388* (2020.01); *H02J 2300/24* (2020.01)

(58) Field of Classification Search
CPC .......... H02J 3/001; H02J 3/0012; H02J 3/381; H02J 3/383; G01R 31/50; G01R 31/52; H02S 50/00; H02S 50/10
See application file for complete search history.

(56) References Cited

U.S. PATENT DOCUMENTS

| | | | |
|---|---|---|---|
| 4,868,481 A * | 9/1989 | Owen | ..................... G05F 1/335 307/14 |
| 2014/0265603 A1* | 9/2014 | Augustoni | .............. H02S 50/00 136/244 |

(Continued)

*Primary Examiner* — Huy Q Phan
*Assistant Examiner* — David B Frederiksen
(74) *Attorney, Agent, or Firm* — Chun-Ming Shih; LANWAY IPR SERVICES

(57) ABSTRACT

A ground-fault detecting device includes: a first detecting module, having a first input terminal, a second input terminal, and a third input terminal coupled to a first-phase electric power, a second-phase electric power, and a third-phase electric power on an AC side of a photovoltaic power generating system respectively, for sampling voltages of the first-phase electric power, the second-phase electric power, and the third-phase electric power to generate a first sampled voltage, a second sampled voltage, and a third sampled voltage respectively; and a controller, coupled to the first detecting module, for determining if a ground-fault occurs in the AC side before the photovoltaic power generating system is connected to a grid according to the first sampled voltage, the second sampled voltage, and the third sampled voltage; wherein the controller generates an alarm signal when the ground-fault occurs in the AC side.

12 Claims, 10 Drawing Sheets

(51) Int. Cl.
*H02J 3/38* (2006.01)
*H02J 3/00* (2006.01)

(56) References Cited

U.S. PATENT DOCUMENTS

| | | | |
|---|---|---|---|
| 2015/0244253 A1* | 8/2015 | Chen | H02M 7/48 |
| | | | 363/56.01 |
| 2016/0245853 A1* | 8/2016 | Weiss | G01R 31/42 |
| 2017/0033679 A1* | 2/2017 | Kaufman | G01R 31/52 |
| 2017/0131340 A1* | 5/2017 | Tallam | B60L 3/04 |
| 2018/0348308 A1* | 12/2018 | Zhang | G01R 19/2513 |

* cited by examiner

GROUND-FAULT DETECTING DEVICE AND RELATED METHOD

RELATED APPLICATION

This application is a continued application of U.S. patent application Ser. No. 16/556,230.

BACKGROUND

In a photovoltaic power generating system, the power generation efficiency of the photovoltaic battery may be affected by the polarization effect and erosion of transparent conductive oxide (TCO). As a result, the lifetime of the solar panel may decrease or the solar panel may be permanently damaged. To solve the above problem, the negative electrode (or the positive electrode) of the photovoltaic battery array may be connected to the ground to form a single point grounding system.

In related art, a fuse may be used to directly connect the negative electrode of the single point grounding system to the ground. When a ground-fault occurs and the fault current is much greater than the rated current of the fuse, the fault current may melt the fuse to form an open circuit between the negative electrode and the ground for protecting the system. However, the related art fails to detect the ground-fault on the AC side of the system. When the grounding cable of the system is exposed to the large fault current for a long time, the insulation aging of the grounding cable may deteriorate the safety of the photovoltaic power generating system or even lead to cable fire.

SUMMARY

The present invention relates to a ground-fault detecting device, and more particularly to a ground-fault detecting device for a photovoltaic power generating system and the related method.

Embodiments of the present invention provide a ground-fault detecting device. The ground-fault detecting device comprises a first detecting module and a controller. The first detecting module has a first input terminal, a second input terminal, and a third input terminal coupled to a first-phase electric power, a second-phase electric power, and a third-phase electric power on an AC (Alternating Current) side of a photovoltaic power generating system respectively, for sampling voltages of the first-phase electric power, the second-phase electric power, and the third-phase electric power to generate a first sampled voltage, a second sampled voltage, and a third sampled voltage respectively. The controller is coupled to the first detecting module for determining if a ground-fault occurs in the AC side before the photovoltaic power generating system is connected to a grid according to the first sampled voltage, the second sampled voltage, and the third sampled voltage. The controller generates an alarm signal when the ground-fault occurs in the AC side.

In one embodiment of the ground-fault detecting device, the first detecting module comprises: a first matching impedance device having a first terminal coupled to the first-phase electric power; a first grounding resistor having a first terminal coupled to a second terminal of the first matching impedance device, and a second terminal coupled to a ground; a second matching impedance device having a first terminal coupled to the second-phase electric power; a second grounding resistor having a first terminal coupled to a second terminal of the second matching impedance device, and a second terminal coupled to the ground; a third matching impedance device having a first terminal coupled to the third-phase electric power; a third grounding resistor having a first terminal coupled to a second terminal of the third matching impedance device, and a second terminal coupled to the ground. The first sampled voltage is a voltage difference between the first terminal and the second terminal of the first grounding resistor; the second sampled voltage is the voltage difference between the first terminal and the second terminal of the second grounding resistor; and the third sampled voltage is the voltage difference between the first terminal and the second terminal of the third grounding resistor.

In one embodiment of the ground-fault detecting device, the first detecting module comprises: a first matching impedance device having a first terminal coupled to the first-phase electric power; a first switch having a first connecting terminal coupled to a second terminal of the first matching impedance device; a grounding resistor having a first terminal coupled to a second connecting terminal of the first switch, and a second terminal coupled to a ground; a second matching impedance device having a first terminal coupled to the second-phase electric power; a second switch having a first connecting terminal coupled to a second terminal of the second matching impedance device, and a second connecting terminal coupled to the first terminal of the grounding resistor; a third matching impedance device having a first terminal coupled to the third-phase electric power; a third switch having a first connecting terminal coupled to a second terminal of the third matching impedance device, and a second connecting terminal coupled to the first terminal of the grounding resistor.

In one embodiment of the ground-fault detecting device, the controller is arranged to obtain the first sampled voltage when the first switch is closed and the second switch and the third switch are opened, to compare the first sampled voltage to a first predetermined threshold voltage, and to generate the alarm signal when the first sampled voltage is smaller than the first predetermined threshold voltage. The controller is further arranged to obtain the second sampled voltage when the second switch is closed and the first switch and the third switch are opened, to compare the second sampled voltage to a second predetermined threshold voltage, and to generate the alarm signal when the second sampled voltage is smaller than the second predetermined threshold voltage. The controller is further arranged to obtain the third sampled voltage when the third switch is closed and the first switch and the second switch are opened, to compare the third sampled voltage to a third predetermined threshold voltage, and to generate the alarm signal when the third sampled voltage is smaller than the third predetermined threshold voltage. The first sampled voltage, the second sampled voltage, and the third sampled voltage are voltage differences between the first terminal and the second terminal of the grounding resistor respectively.

In one embodiment of the ground-fault detecting device, the ground-fault detecting device further comprises: a second detecting module having a first terminal coupled to a grounding electrode on a DC (Direct Current) side of the photovoltaic power generating system, and a second terminal coupled to the ground, for generating a first sampled current; and a third detecting module having a first terminal coupled to a non-grounding electrode on the DC side of the photovoltaic power generating system, and a second terminal coupled to the ground, for generating a second sampled current. The controller is further arranged to determine if the ground-fault occurs in the DC side before the photovoltaic power generating system is connected to the grid and to determine if the ground-fault occurs in the DC side and the AC side when the photovoltaic power generating system is connected to the grid according to the first sampled current and the second sampled current.

In one embodiment of the ground-fault detecting device, the second detecting module comprises a first controllable switch and a first current detecting unit coupled to the first controllable switch in series. The third detecting module comprises a second controllable switch and a second current detecting unit coupled to the second controllable switch in series. The first current detecting unit is arranged to detect the first sampled current flowing to the ground from the grounding electrode when the first controllable switch is closed and the second controllable switch is opened. The second current detecting unit is arranged to detect the second sampled current flowing to the ground from the non-grounding electrode when the second controllable switch is closed and the first controllable switch is opened. The controller is further arranged to generate the alarm signal when the ground-fault occurs.

In one embodiment of the ground-fault detecting device, the alarm signal comprises a first alarm signal and a second alarm signal. The controller comprises: a first comparing unit arranged to compare the first sampled current to a first predetermined threshold value, and to generate the first alarm signal for opening the first controllable switch when the first sampled current is greater than the first predetermined threshold value; and a second comparing unit arranged to compare the second sampled current to a second predetermined threshold value, and to generate the second alarm signal for opening the second controllable switch when the second sampled current is greater than the second predetermined threshold value.

In one embodiment of the ground-fault detecting device, the first current detecting unit comprises a first current sensor arranged to directly sense the first sampled current flowing to the ground from the grounding electrode. The second current detecting unit comprises a second current sensor arranged to directly sense the second sampled current flowing to the ground from the non-grounding electrode.

In one embodiment of the ground-fault detecting device, the second detecting module further comprises a first overcurrent protecting unit coupled to the first current detecting unit in series for opening a connection between the first current detecting unit and the grounding electrode when the ground-fault occurs. The third detecting module further comprises a second overcurrent protecting unit coupled to the second current detecting unit in series for opening the connection between the first current detecting unit and the non-grounding electrode when the ground-fault occurs.

Embodiments of the present invention provide a photovoltaic power generating system. The photovoltaic power generating system comprises: a photovoltaic array arranged to converting solar energy into a DC (Direct Current) power on a DC side; an inverter coupled to the photovoltaic array for converting the DC power into an AC (Alternating Current) power on an AC side; a plurality of switches coupled to the inverter for selectively connecting the AC power to a grid; and a ground-fault detecting device coupled between the AC side and a ground for sampling a voltage of the AC power to detect if a ground-fault occurs in the AC side before the AC power is connected to the grid.

In one embodiment of the photovoltaic power generating system, the ground-fault detecting device comprises: a first detecting module having an input terminal coupled to a specific-phase electric power of the AC power on the AC side for sampling a voltage of the specific-phase electric power to generate a sampled voltage; and a controller coupled to the first detecting module for determining if a ground-fault occurs in the AC side before the AC power is connected to the grid according to the sampled voltage.

In one embodiment of the photovoltaic power generating system, the first detecting module comprises: a matching impedance device having a first terminal coupled to the specific-phase electric power; and a grounding resistor having a first terminal coupled to a second terminal of the matching impedance device, and a second terminal coupled to the ground. The sampled voltage is a voltage difference between the first terminal and the second terminal of the grounding resistor.

In one embodiment of the photovoltaic power generating system, the first detecting module comprises: a matching impedance device having a first terminal coupled to the specific-phase electric power; a switch having a first connecting terminal coupled to a second terminal of the matching impedance device; and a grounding resistor having a first terminal coupled to a second connecting terminal of the switch, and a second terminal coupled to the ground.

In one embodiment of the photovoltaic power generating system, the controller is arranged to obtain the sampled voltage when the switch is closed, to compare the sampled voltage to a predetermined threshold voltage, and to generate an alarm signal when the sampled voltage is smaller than the predetermined threshold voltage. The sampled voltage is a voltage difference between the first terminal and the second terminal of the grounding resistor respectively.

In one embodiment of the photovoltaic power generating system, the photovoltaic power generating system further comprises: a second detecting module having a first terminal coupled to a grounding electrode on the DC side, and a second terminal coupled to the ground, for generating a first sampled current; and a third detecting module having a first terminal coupled to a non-grounding electrode on the DC side, and a second terminal coupled to the ground, for generating a second sampled current. The controller is further arranged to determine if the ground-fault occurs in the DC side before the AC power is connected to the grid and to determine if the ground-fault occurs in the DC side and the AC side when the AC power is connected to the grid according to the first sampled current and the second sampled current.

In one embodiment of the photovoltaic power generating system, the second detecting module comprises: a first controllable switch and a first current detecting unit coupled to the first controllable switch in series. The third detecting module comprises a second controllable switch and a second current detecting unit coupled to the second controllable switch in series. The first current detecting unit is arranged to detect the first sampled current flowing to the ground from the grounding electrode when the first controllable switch is closed and the second controllable switch is opened. The second current detecting unit is arranged to detect the second sampled current flowing to the ground from the non-grounding electrode when the second controllable switch is closed and the first controllable switch is opened. The controller is further arranged to generate the alarm signal when the ground-fault occurs.

In one embodiment of the photovoltaic power generating system, the alarm signal comprises a first alarm signal and a second alarm signal. The controller comprises: a first comparing unit arranged to compare the first sampled current to a first predetermined threshold value, and to generate the first alarm signal for opening the first controllable switch when the first sampled current is greater than the first predetermined threshold value; and a second comparing unit arranged to compare the second sampled current to a second predetermined threshold value, and to generate the second alarm signal for opening the second controllable switch when the second sampled current is greater than the second predetermined threshold value.

Embodiments of the present invention provide a ground-fault detecting method for a photovoltaic power generating system. The ground-fault detecting method comprises: detecting a voltage of a specific-phase electric power of an AC power on an AC side of the photovoltaic power generating system to generate a sampled voltage; determining if a ground-fault occurs in the AC side before the AC power is connected to the grid according to the sampled voltage; and generating an alarm signal when the ground-fault occurs.

In one embodiment of the ground-fault detecting method, the ground-fault detecting method further comprises: comparing the sampled voltage to a predetermined threshold voltage, and generating the alarm signal when the sampled voltage is smaller than the predetermined threshold voltage.

In one embodiment of the ground-fault detecting method, the ground-fault detecting method further comprises: detecting a first sampled current flowing from a grounding electrode on a DC side of the photovoltaic power generating system to a ground when the grounding electrode is connected to the ground and a non-grounding electrode on the DC side is not connected to the ground; detecting a second sampled current flowing from the non-grounding electrode to the ground when the non-grounding electrode is connected to the ground and the grounding electrode is not connected to the ground; and determining if the ground-fault occurs in the DC side before the AC power is connected to the grid and to determine if the ground-fault occurs in the DC side and the AC side when the AC power is connected to the grid according to the first sampled current and the second sampled current.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
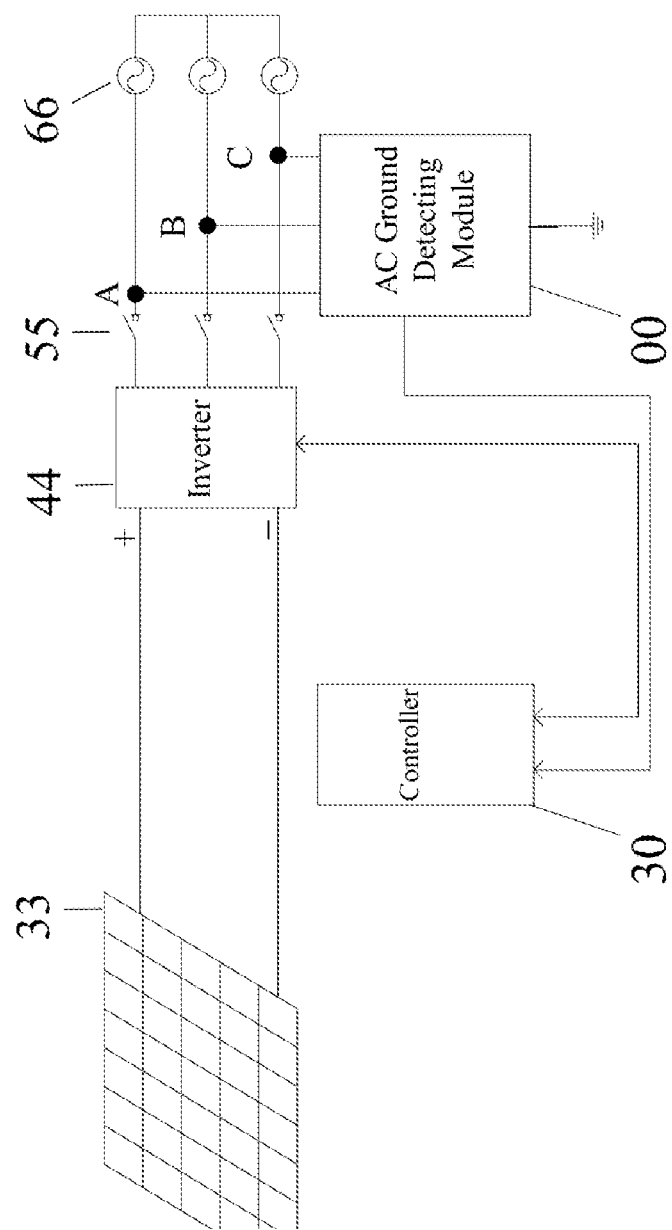
FIG. 1 is a diagram illustrating a photovoltaic power generating system according to a first embodiment of the present invention.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

For description purpose, the photovoltaic power generating system in the specification is merely an exemplary embodiment of the single point grounding system. The present single point grounding system may comprise a photovoltaic array arranged to converting solar energy into a DC (Direct Current) power on a DC side; an inverter coupled to the photovoltaic array, for converting the DC power into an AC (Alternating Current) power on an AC side; a plurality of AC switches coupled to the inverter, for selectively connecting the AC power to a grid; and a ground-fault detecting device coupled between the AC side and a ground, for sampling voltages of the AC power to detect if a ground-fault occurs in the AC side before the AC power is connected to the grid. The single point grounding system may be a photovoltaic power generating system having only one grounding node, which may be installed on the positive electrode or the negative electrode of the output terminal of the photovoltaic array. The AC power may comprises a plurality of specific-phase electric powers. For brevity, the embodiments of the present invention are negative grounding systems.

FIG. 1 is a diagram illustrating a photovoltaic power generating system according to a first embodiment of the present invention. As shown in FIG. 1, the photovoltaic power generating system may comprise a photovoltaic array (i.e. 33), an inverter (i.e. 44), a plurality of AC switches (i.e. 55), and a ground-fault detecting device. The connectivity among the photovoltaic array, the inverter, the plurality of AC switches, and the ground-fault detecting device has been described in the above paragraph, and the detailed description is omitted here for brevity. The ground-fault detecting device of the present embodiment comprises an AC ground detecting module 00 and a controller 30.

The input terminals of the AC ground detecting module 00 are connected to the A phase electric power (i.e. the node A in FIG. 1), the B phase electric power (i.e. the node B in FIG. 1), and the C phase electric power (i.e. the node C in FIG. 1) on the AC side of the photovoltaic power generating system respectively. According to the embodiment, the phases of the A phase electric power, the B phase electric power, and the C phase electric power may be different with each other. The AC ground detecting module 00 is arranged to sample the voltage between the A phase electric power and the ground, the voltage between the B phase electric power and the ground, and the voltage between the C phase electric power and the ground, for obtaining a first sampled voltage, a second sampled voltage, and a third sampled voltage. The AC ground detecting module 00 further outputs the first sampled voltage, the second sampled voltage, and the third sampled voltage to the controller 30.

The controller 30 is arranged to determine if the ground-fault occurs in the AC side of the photovoltaic power generating system before the photovoltaic power generating system is connected to a grid (e.g. the grid 66 in FIG. 1) according to the first sampled voltage, the second sampled voltage, and the third sampled voltage. If the ground-fault occurs, then the controller 30 generates an alarm signal.

The operation of the ground-fault detecting device is described as follow: 1) obtaining the sampled voltage between the A phase electric power and the ground, the sampled voltage between the B phase electric power and the ground, and the sampled voltage between the C phase electric power and the ground; 2) determining if the ground-fault occurs in the AC side of the photovoltaic power generating system before the photovoltaic power generating system is connected to the grid according to the above mentioned sampled voltages; 3) If the ground-fault occurs, then generating the alarm signal.

The advantages of the ground-fault detecting device and related method of the present embodiments are described as follow: In comparison to the related art, the present ground-fault detecting device samples the voltage(s) between the three-phase AC power on the AC side and the ground by using the detecting module installed between the AC side and the ground. The controller 30 is then arranged to determine if the ground-fault occurs in the AC side before the photovoltaic power generating system is connected to the grid according to the information of the sampled voltages. As the photovoltaic power generating system is capable of detecting the ground-fault on the AC side, the grounding cable of the system may not be exposed to the large fault current for a long time, and the insulation aging of the grounding cable or the cable fire problem may be avoided.

In one embodiment, the AC ground detecting module 00 comprises: a first matching impedance device, a first grounding resistor, a second matching impedance device, a second grounding resistor, a third matching impedance device, and a third grounding resistor.

The first terminal of the first matching impedance device is coupled to the A phase electric power on the AC side. The second terminal of the first matching impedance device is coupled to the first terminal of the first grounding resistor. The second terminal of the first grounding resistor is connected to ground. The first terminal of the second matching impedance device is coupled to the B phase electric power on the AC side. The second terminal of the second matching impedance device is coupled to the first terminal of the second grounding resistor. The second terminal of the second grounding resistor is connected to the ground. The first terminal of the third matching impedance device is coupled to the C phase electric power on the AC side. The second terminal of the third matching impedance device is coupled to the first terminal of the third grounding resistor. The second terminal of the third grounding resistor is connected to the ground.

The A phase electric power on the AC side is coupled to the ground by passing through the first matching impedance device and the first grounding resistor. The B phase electric power on the AC side is coupled to the ground by passing through the second matching impedance device and the second grounding resistor. The C phase electric power on the AC side is coupled to the ground by passing through the third matching impedance device and the third grounding resistor.

In addition, the first sampled voltage is the voltage difference between the two terminals of the first grounding resistor. The second sampled voltage is the voltage difference between the two terminals of the second grounding resistor. The third sampled voltage is the voltage difference between the two terminals of the third grounding resistor.

In one exemplary embodiment, the controller 30 may comprise a first voltage comparing unit, a second voltage comparing unit, and a third voltage comparing unit.

The first voltage comparing unit is arranged to compare the first sampled voltage to a first predetermined threshold voltage. If the first sampled voltage is smaller than the first predetermined threshold voltage, then the alarm signal is generated. The second voltage comparing unit is arranged to compare the second sampled voltage to a second predetermined threshold voltage. If the second sampled voltage is smaller than the second predetermined threshold voltage, then the alarm signal is generated. The third voltage comparing unit is arranged to compare the third sampled voltage to a third predetermined threshold voltage. If the third sampled voltage is smaller than the third predetermined threshold voltage, then the alarm signal is outputted.

According to the embodiment, the above mentioned three voltage comparing units may be arranged to detect the first sampled voltage, the second sampled voltage, and the third sampled voltage at the same time respectively, and to generate the alarm signals at the same time. Therefore, the efficiency of the detection is improved.

Figure 2:
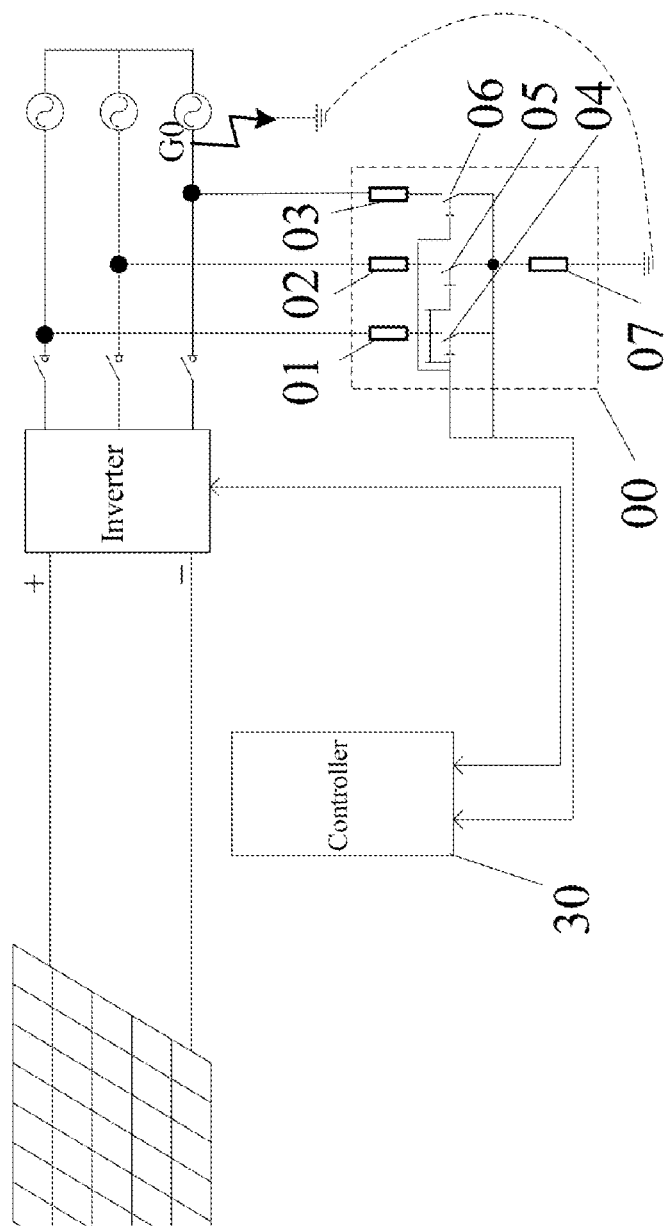
FIG. 2 is a diagram illustrating a photovoltaic power generating system according to a second embodiment of the present invention.

FIG. 2 is a diagram illustrating a photovoltaic power generating system according to a second embodiment of the present invention. According to another embodiment as shown in FIG. 2, the first detecting module may comprise a first matching impedance device 01, a first switch 04, a second matching impedance device 02, a second switch 05, a third matching impedance device 03, a third switch 06, and a grounding resistor 07.

The first matching impedance device 01 and the first switch 04 are connected in series to form a first circuit branch. The second matching impedance device 02 and the second switch 05 are connected in series to form a second circuit branch. The third matching impedance device 03 and the third switch 06 are connected in series to form a third circuit branch.

The first terminal of the first circuit branch is coupled to the A phase electric power on the AC side, and the second terminal of the first circuit branch is coupled to the ground through the grounding resistor 07. The first terminal of the second circuit branch is coupled to the B phase electric power on the AC side, and the second terminal of the second circuit branch is coupled to the ground through the grounding resistor 07. The first terminal of the third circuit branch is coupled to the C phase electric power on the AC side, and the second terminal of the third circuit branch is coupled to the ground through the grounding resistor 07.

The controller 30 is arranged to receive the first sampled voltage when the first switch 04 is closed and the second switch 05 and the third switch 06 are opened. The controller 30 is further arranged to compare the first sampled voltage to the first predetermined threshold voltage. If the first sampled voltage is smaller than the first predetermined threshold voltage, then the controller generates the alarm signal. The controller 30 is further arranged to receive the second sampled voltage when the second switch 05 is closed and the first switch 04 and the third switch 06 are opened. The controller 30 is further arranged to compare the second sampled voltage to the second predetermined threshold voltage. If the second sampled voltage is smaller than the second predetermined threshold voltage, then the controller generates the alarm signal. The controller 30 is further arranged to receive the third sampled voltage when the third switch 06 is closed and the first switch 04 and the second switch 05 are opened. The controller 30 is further arranged to compare the third sampled voltage to the third predetermined threshold voltage. If the third sampled voltage is smaller than the third predetermined threshold voltage, then the controller generates the alarm signal.

In addition, the first sampled voltage, the second sampled voltage, and the third sampled voltage are the voltages between the two terminals of the grounding resistor 07.

In this embodiment, the controller 30 may detect the first sampled voltage, the second sampled voltage, and the third sampled voltage by using a single comparing unit (not shown). Therefore, the structure of the controller 30 is relatively simple.

Before the photovoltaic power generating system is booted to connect the grid, the first sampled voltage, the second sampled voltage, and the third sampled voltage are obtained by controlling the on/off of the first switch 04, the second switch 05, and the third switch 06 when the AC three-phase electric power is under normal condition. As shown in FIG. 2, if any phase power in the three-phase electric power (i.e. the A, B, and C phase electric powers) is shorted to the ground, the controller 30 may acknowledge that a grounding fault occurs in the AC side by detecting the voltage variation between the two terminals of the grounding resistor 07. When the grounding fault occurs in the AC side, the inverter is not booted to guarantee the safety of the system.

Figure 3:
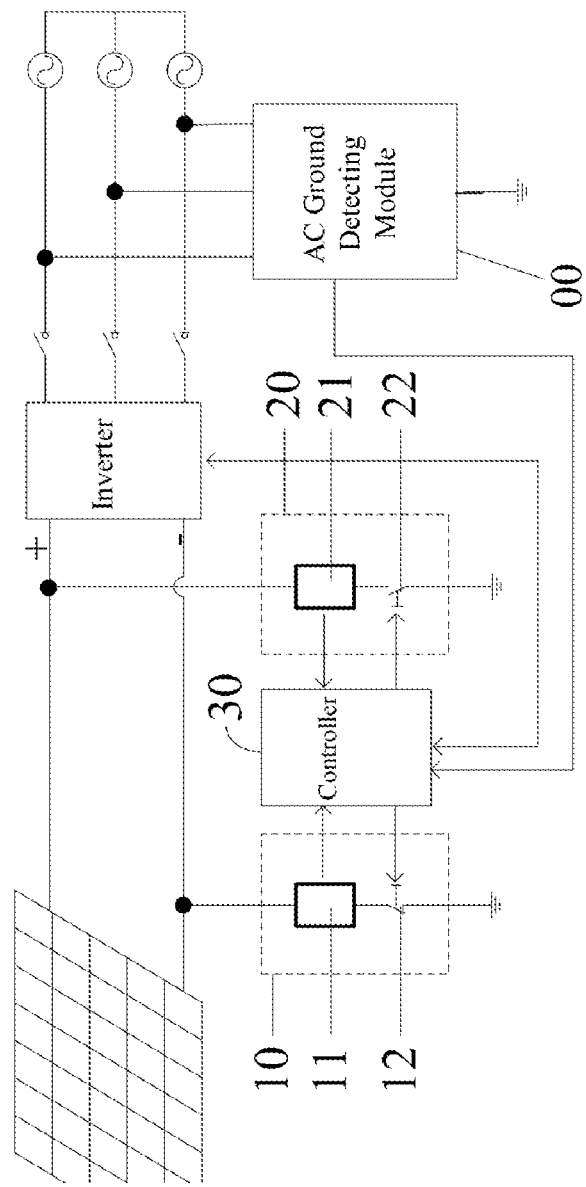
FIG. 3 is a diagram illustrating a photovoltaic power generating system according to a third embodiment of the present invention.

FIG. 3 is a diagram illustrating a photovoltaic power generating system according to a third embodiment of the present invention. As shown in the embodiment of FIG. 3, the ground-fault detecting device may comprise a first detecting module 10, a second detecting module 20, the AC ground detecting module 00, and the controller 30.

The first detecting module 10 comprises a first controllable switch 12 and a first current detecting unit 11, wherein the first controllable switch 12 and the first current detecting unit 11 are connected in series. The first terminal of the first detecting module 10 is coupled to the grounding electrode (i.e. the inverting node"−" in FIG. 3) of the photovoltaic power generating system, and the second terminal of the first detecting module 10 is coupled to the ground.

The second detecting module 20 comprises a second controllable switch 22 and a second current detecting unit 21, wherein the second controllable switch 22 and the second current detecting unit 21 are connected in series. The first terminal of the second detecting module 20 is coupled to the non-grounding electrode (i.e. the non-inverting node"+" in FIG. 3) of the photovoltaic power generating system, and the second terminal of the second detecting module 20 is coupled to the ground.

The first current detecting unit 11 is arranged to obtain the first sampled current from the grounding electrode to the ground when the first controllable switch 12 is closed and the second controllable switch 22 is opened, and to transmit the first sampled current to the controller 30.

The second current detecting unit 21 is arranged to obtain the second sampled current from the non-grounding electrode to the ground when the second controllable switch 22 is closed and the first controllable switch 12 is opened, and to transmit the second sampled current to the controller 30.

The controller 30 is arranged to detect the DC side of the photovoltaic power generating system before the photovoltaic power generating system is connected to the grid according to the first sampled current and the second sampled current. The controller 30 is further arranged to determine if ground-fault occurs in the DC side and the AC side of the photovoltaic power generating system when the photovoltaic power generating system is connected the grid according to the first sampled current and the second sampled current. When the ground-fault occurs, the controller 30 generates the alarm signal.

According to the embodiment, the grounding electrode may be the only electrode in the photovoltaic power generating system that connects to the ground. In the negative grounding system, the grounding electrode is the negative electrode, and the non-grounding electrode is the electrode opposite to the grounding electrode. Therefore, in the negative grounding system, the non-grounding electrode is the positive electrode.

The operation of the circuits in the ground-fault detecting device is described as follow: the first current detecting unit 11 is arranged to obtain the first sampled current from the grounding electrode to the ground when the first controllable switch 12 is closed and the second controllable switch 22 is opened, and to transmit the first sampled current to the controller 30; the second current detecting unit 21 is arranged to obtain the second sampled current from the non-grounding electrode to the ground when the second controllable switch 22 is closed and the first controllable switch 12 is opened, and to transmit the second sampled current to the controller 30; the controller 30 is arranged to determine if the ground-fault occurs in the DC side of the photovoltaic power generating system before the photovoltaic power generating system is connected to the grid and to determine if the ground-fault occurs in the DC side and the AC side of the photovoltaic power generating system when the photovoltaic power generating system is connected the grid according to the first sampled current and the second sampled current; and when the ground-fault occurs, the controller 30 generates the alarm signal.

In comparison to the related art, in the ground-fault detecting device, the first detecting module 10 is arranged to detect the ground-fault of the non-grounding electrode before the system is connected to the grid and to detect the ground-fault on the AC side when the photovoltaic power generating system is connected to the grid; and the second detecting module 20 is arranged to detect the ground-faults of the grounding electrode and the AC side before the system is connected to the grid. Accordingly, the present invention is able to effectively detect the ground-faults of the photovoltaic power generating system before the photovoltaic power generating system is connected to the grid, and the ground-faults of the non-grounding electrode and the AC side of the photovoltaic power generating system when the photovoltaic power generating system is connected to the grid. It is noted that, when the photovoltaic power generating system is connected to the grid, the A phase electric power, the B phase electric power, and the C phase electric power of the AC power may be transmitted to the grid.

Figure 4:
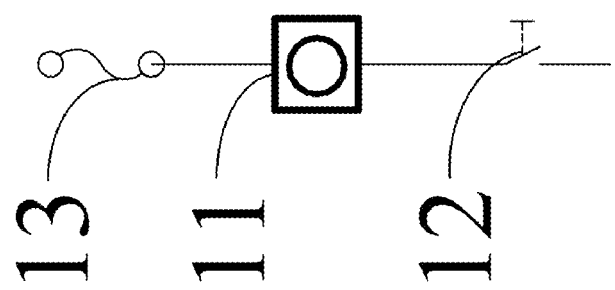
FIG. 4, which is a diagram illustrating a first detecting module according to an embodiment of the present invention.
Figure 5:
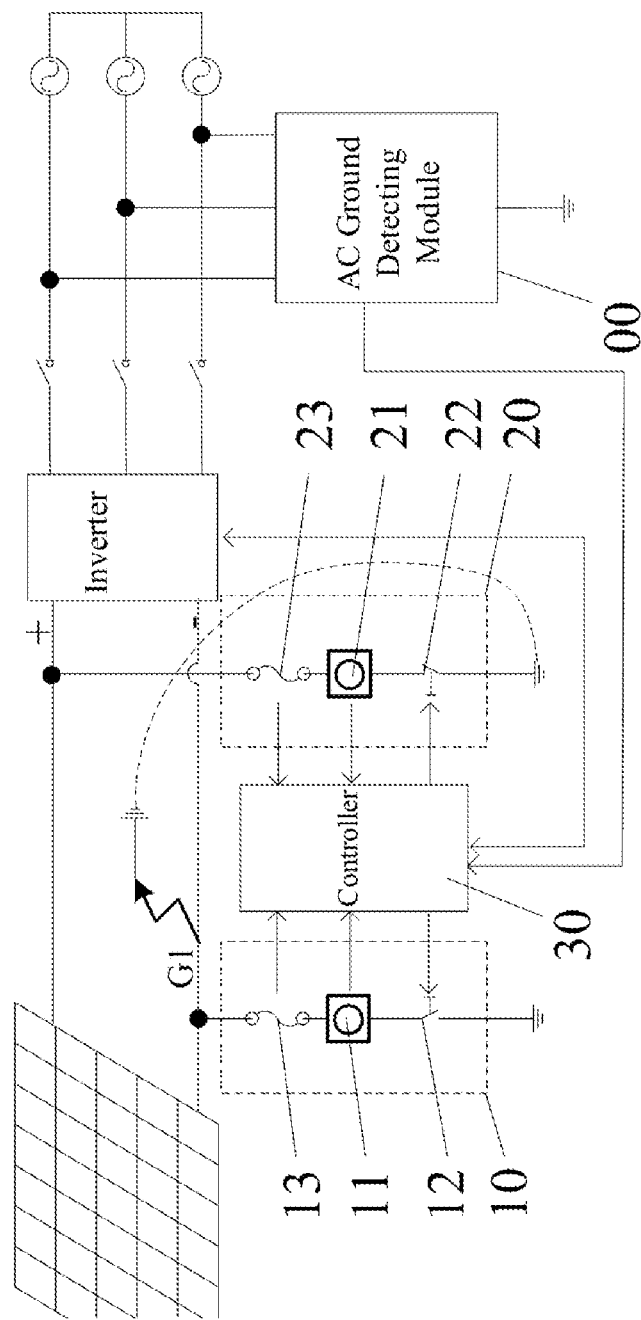
FIG. 5 is a diagram illustrating a photovoltaic power generating system before connected to the grid according to an embodiment of the present invention.

FIG. 5 is a diagram illustrating a photovoltaic power generating system before connected to the grid according to an embodiment of the present invention. As shown in FIG. 5, before the photovoltaic power generating system is booted to connect the grid, the first controllable switch 12 is opened, and the second controllable switch 22 is closed. At this point, according to the circuit as shown in FIG. 4, which is a diagram illustrating the first detecting module 10 or the second detecting module 20 according to an embodiment of the present invention, if the resistance between the negative electrode (i.e. "−") and the ground is relatively small or the path between the negative electrode and the ground is a short circuit, then the fault node G1 may connect to the positive electrode (i.e. "+") through the second controllable switch 22 and the second current detecting unit 21 such that a short circuit is formed between the negative electrode and the positive electrode, and the detected second sampled current increases accordingly. When the controller 30 detects the abnormal current, the controller 30 may open the second controllable switch 22, and generate an alarm signal to stop booting the inverter for protecting the system.

Figure 6:
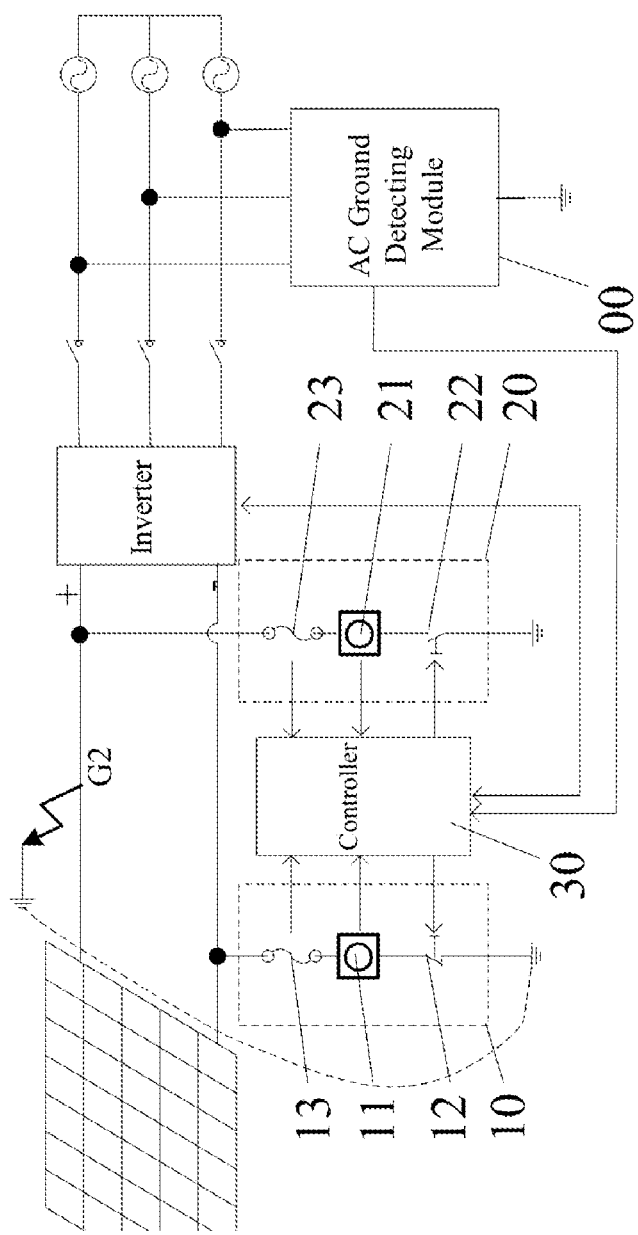
FIG. 6 is a diagram illustrating a photovoltaic power generating system before connected to the grid according to an embodiment of the present invention.

FIG. 6 is a diagram illustrating a photovoltaic power generating system before connected to the grid according to an embodiment of the present invention. As shown in FIG. 6, before the photovoltaic power generating system is booted to connect the grid, the second controllable switch 22 is opened, and the first controllable switch 12 is closed. At this point, according to the circuit as shown in FIG. 4, if the resistance between the positive electrode and the ground is relatively small or the path between the positive electrode and the ground is a short circuit, then the fault node G2 may connect to the negative electrode through the first controllable switch 12 and the first current detecting unit 11 such that a short circuit is formed between the negative electrode and the positive electrode, and the detected first sampled current increases accordingly. When the controller 30 detects the abnormal current, the controller 30 may open the first controllable switch 12, and generate an alarm signal to stop booting the inverter for protecting the system.

In addition, when a short circuit is formed between the positive electrode and the ground when the photovoltaic power generating system is connected to the grid, the circuit as shown in FIG. 4 may also be applied to protect the system.

Figure 7:
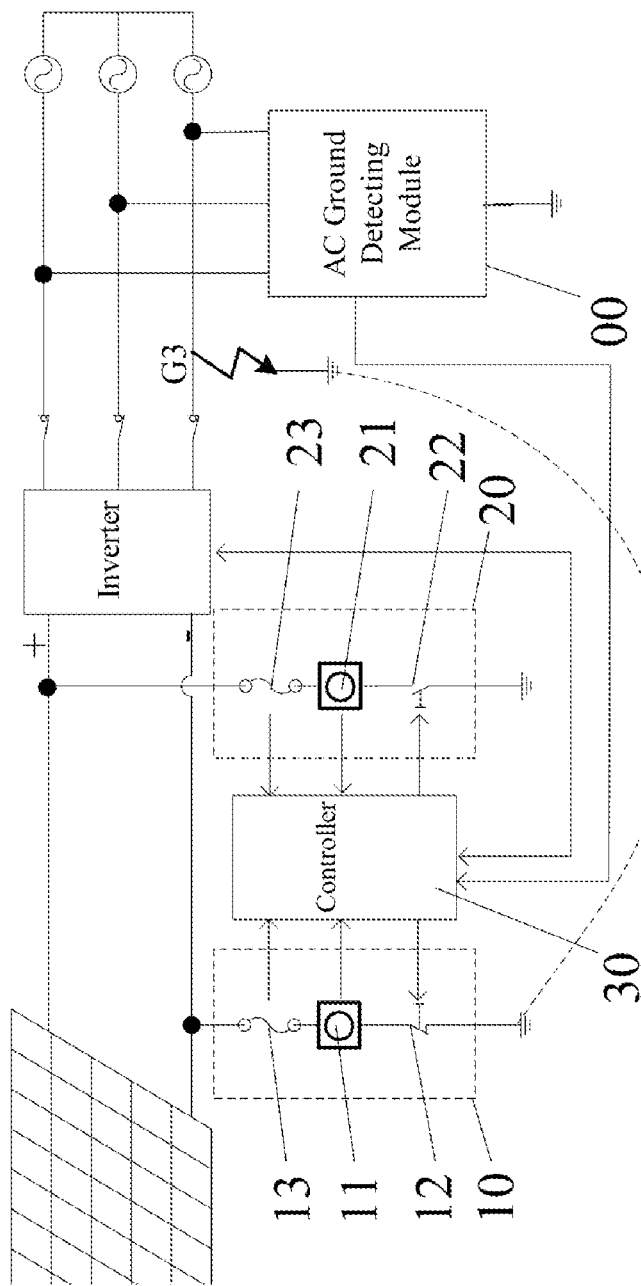
FIG. 7 is a diagram illustrating a photovoltaic power generating system under AC side detection according to an embodiment of the present invention.
Figure 8:
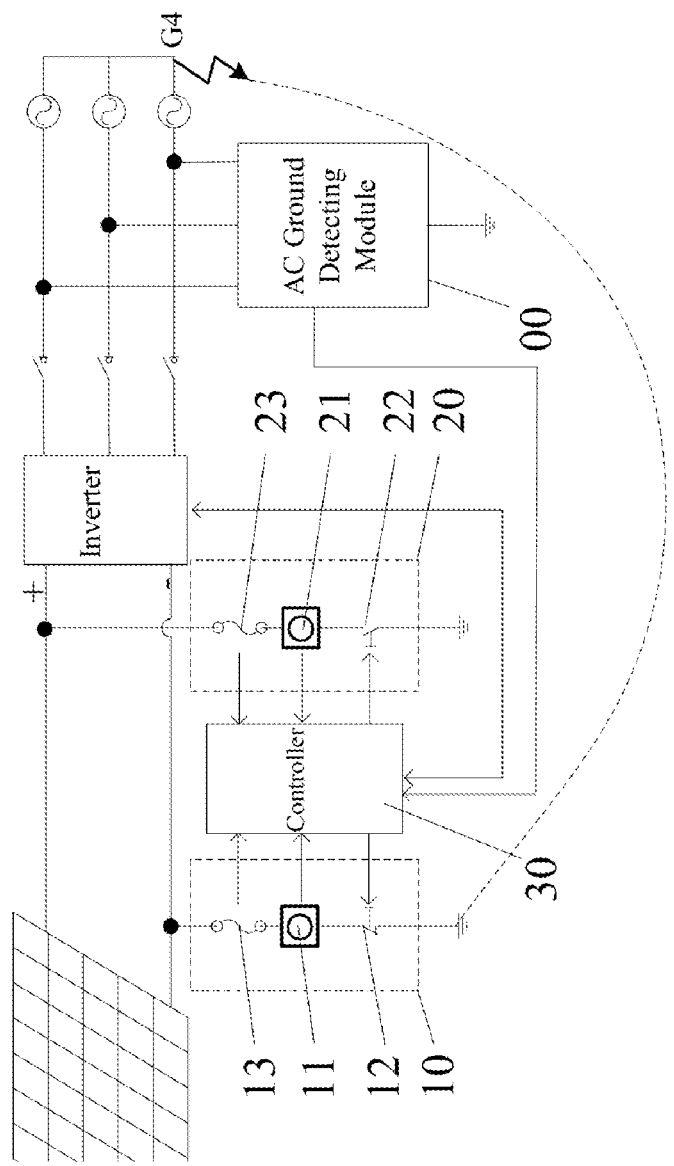
FIG. 8 is a diagram illustrating a photovoltaic power generating system under AC side detection according to an embodiment of the present invention.

FIG. 7 is a diagram illustrating a photovoltaic power generating system under AC side detection according to an embodiment of the present invention. FIG. 8 is a diagram illustrating a photovoltaic power generating system under AC side detection according to an embodiment of the present invention. As shown in FIG. 7 and FIG. 8, when the insulation problem on the DC side is resolved, the first controllable switch 12 may operate normally for coupling the negative electrode to the ground, and the inverter may be booted normally. According to the invention, an I-type three-level non-isolated inverter topology is applied in the present embodiment. If the AC single-phase shorts to the ground or the neutral-point shorts to the ground or the resistance between the neutral-point and the ground is relatively small after the inverter is connected to the grid, then the AC voltage may pass through the loop circuit as shown in FIG. 5 and FIG. 6, or to pass through the loop formed by the grounding node G3 or the grounding node G4, the first controllable switch 12, and the first current detecting unit 11. As a result, a short circuit is formed between the positive electrode and the negative electrode, and the detected current may increase. When the controller 30 detects the abnormal current, the controller 30 may open the first controllable switch 12, and generate an alarm signal to shut down the inverter for protecting the system.

In one exemplary embodiment, the controller 30 comprises a switch controlling unit (not shown). The switch controlling unit is arranged to control the alternately open and close of the first controllable switch 12 and the second controllable switch 22 before the photovoltaic power generating system is connected to the grid.

In one embodiment, the controller 30 comprises a first comparing unit and a second comparing unit (not shown). The first comparing unit is arranged to compare the first sampled current to the first predetermined threshold value. If the first sampled current is greater than the first predetermined threshold value, then the controller 30 generates the first alarm signal, and opens the first controllable switch 12 according to the first alarm signal. The second comparing unit is arranged to compare the second sampled current to the second predetermined threshold value. If the second sampled current is greater than the second predetermined threshold value, then the controller 30 generates the second alarm signal, and opens the second controllable switch 22 according to the second alarm signal. Therefore, the above mentioned alarm signal may comprise the first alarm signal and the second alarm signal.

Furthermore, the first comparing unit may be applied to generate a signal to shut down the inverter of the photovoltaic power generating system when the photovoltaic power generating system is connected to the grid according to the first alarm signal.

In one embodiment, as shown in FIG. 4, the first current detecting unit 11 may be a first current sensor. The first current sensor is arranged to directly detect the first sampled current. The second current detecting unit 21 may be a second current sensor. The second current sensor is arranged to directly detect the second sampled current.

In one embodiment, as shown in FIG. 4, the first detecting module 10 may comprise a first overcurrent protecting unit 13, which is coupled to the first current detecting unit 11 in series. The second detecting module 20 may comprise a second overcurrent protecting unit 23, which is coupled to the second current detecting unit 21 in series.

In one exemplary embodiment, the first overcurrent protecting unit 13 and/or the second overcurrent protecting unit 23 may be implemented by a fuse.

When the first controllable switch 12 and the second controllable switch 22 are unable to open under abnormal condition, e.g. when the ground-fault problems mentioned in FIG. 3 to FIG. 6 occur, the first overcurrent protecting unit 13 or the second overcurrent protecting unit 23 may burn or melt. Then, the controller 30 may detect the open circuit of the first overcurrent protecting unit 13 or the second overcurrent protecting unit 23, and the controller 30 may generate an alarm signal to stop booting or shut down the inverter for protecting the system.

Figure 9:
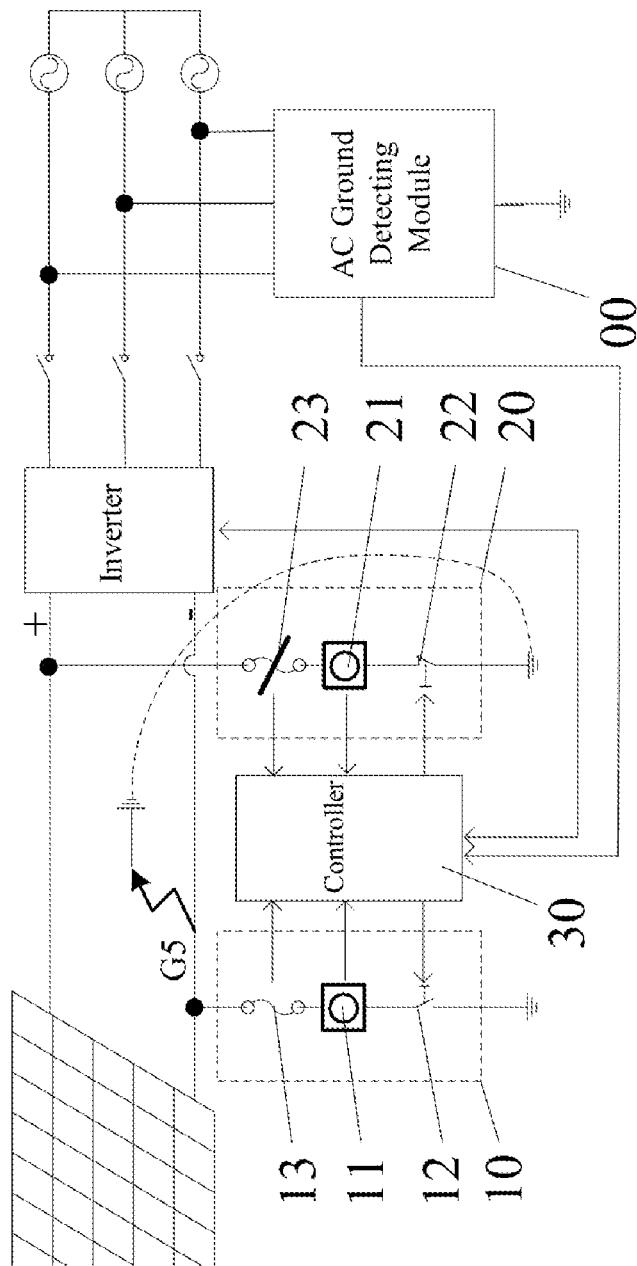
FIG. 9 is a diagram illustrating a photovoltaic power generating system under DC side detection according to an embodiment of the present invention.

FIG. 9 is a diagram illustrating a photovoltaic power generating system under DC side detection according to an embodiment of the present invention. In practice, as shown in FIG. 9, when the second controllable switch 22 is unable to open under abnormal condition, the grounding node G5 may connect to the positive electrode through the second controllable switch 22, the second current detecting unit 21, and the second overcurrent protecting unit 23 such that a short circuit is formed between the positive electrode and the negative electrode. Then, the second overcurrent protecting unit 23 burns or melts. Then, the controller 30 may detect the open circuit of the second overcurrent protecting unit 23, and the controller 30 may generate an alarm signal to stop booting or shut down the inverter for protecting the system.

The present invention further provides an embodiment of a single point grounding system. The single point grounding system may comprise any of the ground-fault detecting devices as disclosed in the above embodiments. The single point grounding system may further comprise a photovoltaic array, an inverter, AC switches, and the other elements that form the photovoltaic power generating system. By using the ground-fault detecting device, a pre-detecting process may be performed before the system is connected to the grid and a real-time detecting process may be performed when the photovoltaic power generating system is connected to the grid to guarantee the safety of the system.

Figure 10:
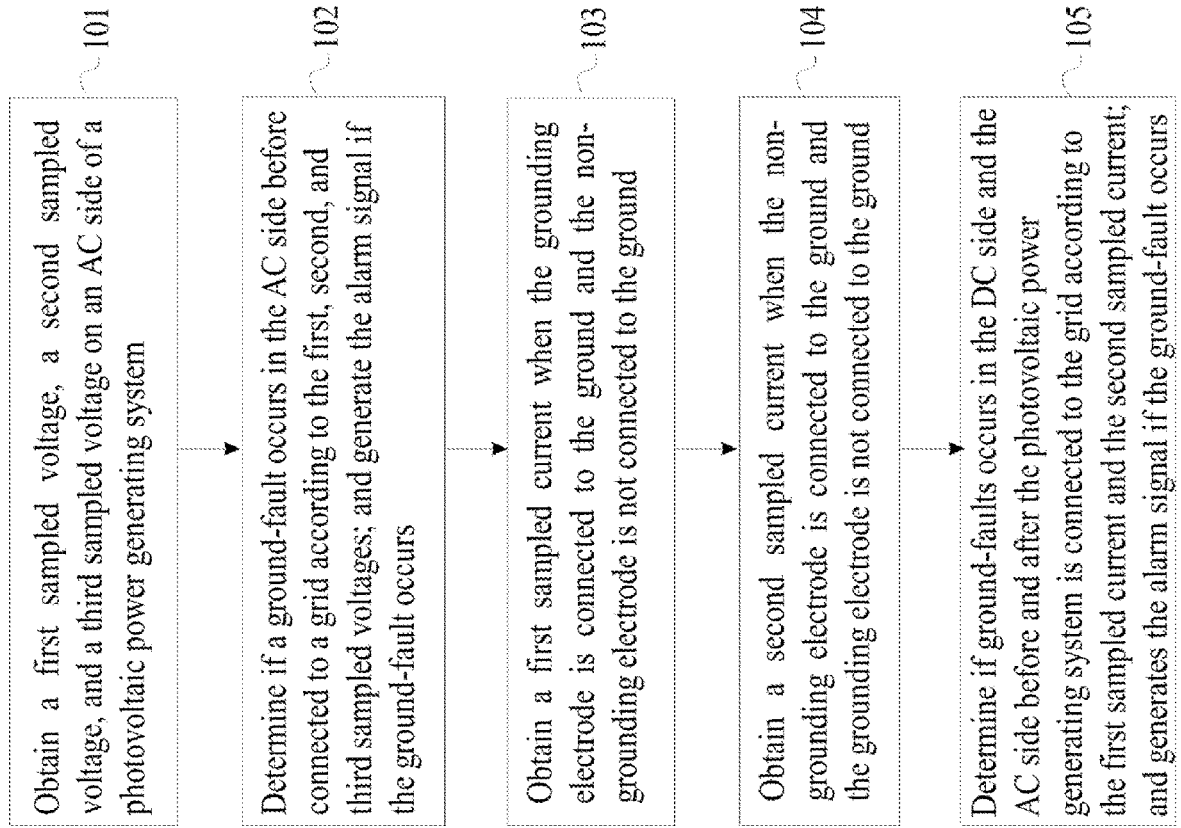
FIG. 10 is a flowchart illustrating a ground-fault detecting method according to an embodiment of the present invention.

FIG. 10 is a flowchart illustrating a ground-fault detecting method according to an embodiment of the present invention. As shown in FIG. 10, the method comprises steps 101~102. Provided that substantially the same result is achieved, the steps of the flowchart shown in FIG. 10 need not be in the exact order shown and need not be contiguous; that is, other steps can be intermediate.

Step 101: Obtaining the first sampled voltage between the A phase electric power on the AC side of the photovoltaic power generating system and the ground, the second sampled voltage between the B phase electric power on the AC side of the photovoltaic power generating system and the ground, and the third sampled voltage between the C phase electric power on the AC side of the photovoltaic power generating system and the ground.

Step 102: Determining if the ground-fault occurs in the AC side of the photovoltaic power generating system before the photovoltaic power generating system is connected to the grid according to the first sampled voltage, the second sampled voltage, and the third sampled voltage; and if the ground-fault occurs, then generating the alarm signal.

According to the embodiment, the present method is arranged to sample the voltage between the three-phase AC power on the AC side and the ground by using the detecting module installed between the AC side and the ground. The method further determines if the ground-fault occurs in the AC side before the system is connected to the grid according to the information of the sampled voltages by using the controller 30. As the photovoltaic power generating system is capable of detecting the ground-fault on the AC side, the grounding cable of the system may not be exposed to the large fault current for a long time, and the insulation aging of the grounding cable or the cable fire problem may be avoided.

In addition, the method of detecting the ground-fault further comprises steps 103~105:

Step 103: Obtaining the first sampled current from the grounding electrode to the ground when the grounding electrode on the DC side of the photovoltaic power generating system is connected to the ground and the non-grounding electrode is not connected to the ground.

Step 104: Obtaining the second sampled current from the non-grounding electrode to the ground when the non-grounding electrode on the DC side of the photovoltaic power generating system is connected to the ground and the grounding electrode is not connected to the ground.

Step 105: Determining if ground-faults occur in the DC side of the photovoltaic power generating system before the photovoltaic power generating system is connected to the grid and in the DC side and the AC side of the photovoltaic power generating system when the photovoltaic power generating system is connected to the grid according to the first sampled current and the second sampled current; and generating the alarm signal if the ground-fault occurs.

In one embodiment, the step 105 comprises steps 1051~1052:

In step 1051, the first sampled current and the first predetermined threshold value are compared. If the first sampled current is greater than the first predetermined threshold value, then the first alarm signal is generated, and the connection between the grounding electrode and the ground is opened according to the first alarm signal.

In step 1052, the second sampled current and the second predetermined threshold value are compared. If the second sampled current is greater than the second predetermined threshold value, then the second alarm signal is generated, and the connection between the non-grounding electrode and the ground is opened according to the second alarm signal.

Moreover, the alarm signal may comprise the first alarm signal and the second alarm signal.

Based on the above mentioned embodiments, the method of detecting the ground-fault further comprises step 106.

In step 106, the inverter in the photovoltaic power generating system is turned off when the photovoltaic power generating system is connected to the grid according to the first alarm signal.

According to the embodiment of the present method of detecting the ground-fault, the first sampled current from the grounding electrode of the photovoltaic power generating system to the ground is obtained by connecting the grounding electrode to the ground and not connecting the non-grounding electrode to the ground, and the second sampled current from the non-grounding electrode of the photovoltaic power generating system to the ground is obtained by connecting the non-grounding electrode to the ground and not connecting the grounding electrode to the ground. Then, the method determines if abnormal grounding connection occurs according to the first sampled current and the second sampled current. Accordingly, the method is able to effectively detect the ground-fault(s) of the photovoltaic power generating system before the photovoltaic power generating system is connected to the grid and when the photovoltaic power generating system is connected to the grid such that the system may operate normally. In addition, when the voltage between the three-phase AC power on the AC side and the ground is obtained by using the detecting module installed between the AC side and the ground, the controller 30 may be used to determine if the ground-fault occurs in AC side before the system is connected to the grid according to the sampled voltages. Therefore, the ground-faults on the AC side of the photovoltaic power generating system may be effectively detected.

In addition, terms such as "first" and "second" are used herein for purposes of description and are not intended to indicate or imply relative importance or significance or to imply the number of indicated technical features. Thus, the feature defined with "first" and "second" may include one or more of this feature. In the description of the present disclosure, "a plurality of" means two or more than two, unless specified otherwise.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A ground-fault detecting device, comprising:
   a first detecting module, having a first input terminal, a second input terminal, and a third input terminal coupled to a first-phase electric power, a second-phase electric power, and a third-phase electric power on an AC (Alternating Current) side of a photovoltaic power generating system respectively, for sampling voltages of the first-phase electric power, the second-phase electric power, and the third-phase electric power to generate a first sampled voltage, a second sampled voltage, and a third sampled voltage respectively; and
   a controller, coupled to the first detecting module, for determining if a ground-fault occurs in the AC side before the photovoltaic power generating system is connected to a grid according to the first sampled voltage, the second sampled voltage, and the third sampled voltage;
   wherein the controller generates an alarm signal when the ground-fault occurs in the AC side, wherein the first detecting module comprises:
   a first matching impedance device, having a first terminal coupled to the first-phase electric power;
   a first grounding resistor, having a first terminal coupled to a second terminal of the first matching impedance device, and a second terminal coupled to a ground;
   a second matching impedance device, having a first terminal coupled to the second-phase electric power;
   a second grounding resistor, having a first terminal coupled to a second terminal of the second matching impedance device, and a second terminal coupled to the ground;
   a third matching impedance device, having a first terminal coupled to the third-phase electric power;
   a third grounding resistor, having a first terminal coupled to a second terminal of the third matching impedance device, and a second terminal coupled to the ground;
   wherein the first sampled voltage is a voltage difference between the first terminal and the second terminal of the first grounding resistor; the second sampled voltage is the voltage difference between the first terminal and the second terminal of the second grounding resistor; the third sampled voltage is the voltage difference between the first terminal and the second terminal of the third grounding resistor.

2. The ground-fault detecting device of claim 1, wherein the controller is arranged to obtain the first sampled voltage when a first switch is closed and a second switch and a third switch are opened, to compare the first sampled voltage to a first predetermined threshold voltage, and to generate the alarm signal when the first sampled voltage is smaller than the first predetermined threshold voltage;
   the controller is further arranged to obtain the second sampled voltage when the second switch is closed and the first switch and the third switch are opened, to compare the second sampled voltage to a second predetermined threshold voltage, and to generate the alarm signal when the second sampled voltage is smaller than the second predetermined threshold voltage; and
   the controller is further arranged to obtain the third sampled voltage when the third switch is closed and the first switch and the second switch are opened, to compare the third sampled voltage to a third predetermined threshold voltage, and to generate the alarm signal when the third sampled voltage is smaller than the third predetermined threshold voltage;
   wherein the first sampled voltage, the second sampled voltage, and the third sampled voltage are voltage differences between the first terminal and the second terminal of the grounding resistor respectively.

3. The ground-fault detecting device of claim 2, further comprising:
   a second detecting module, having a first terminal coupled to a grounding electrode on a DC (Direct Current) side of the photovoltaic power generating system, and a second terminal coupled to the ground, for generating a first sampled current; and
   a third detecting module, having a first terminal coupled to a non-grounding electrode on the DC side of the photovoltaic power generating system, and a second terminal coupled to the ground, for generating a second sampled current;
   wherein the controller is further arranged to determine if the ground-fault occurs in the DC side before the photovoltaic power generating system is connected to the grid and to determine if the ground-fault occurs in the DC side and the AC side when the photovoltaic power generating system is connected to the grid according to the first sampled current and the second sampled current.

4. The ground-fault detecting device of claim 3, wherein the second detecting module comprises:
   a first controllable switch; and
   a first current detecting unit, coupled to the first controllable switch in series; and
   the third detecting module comprises:
   a second controllable switch; and
   a second current detecting unit, coupled to the second controllable switch in series;
   wherein the first current detecting unit is arranged to detect the first sampled current flowing to the ground from the grounding electrode when the first controllable switch is closed and the second controllable switch is opened;

the second current detecting unit is arranged to detect the second sampled current flowing to the ground from the non-grounding electrode when the second controllable switch is closed and the first controllable switch is opened; and the controller is further arranged to generate the alarm signal when the ground-fault occurs.

5. The ground-fault detecting device of claim 4, wherein the alarm signal comprises a first alarm signal and a second alarm signal, and the controller comprises:

a first comparing unit, arranged to compare the first sampled current to a first predetermined threshold value, and to generate the first alarm signal for opening the first controllable switch when the first sampled current is greater than the first predetermined threshold value; and a second comparing unit, arranged to compare the second sampled current to a second predetermined threshold value, and to generate the second alarm signal for opening the second controllable switch when the second sampled current is greater than the second predetermined threshold value.

6. The ground-fault detecting device of claim 4, wherein the first current detecting unit comprises:

a first current sensor, arranged to directly sense the first sampled current flowing to the ground from the grounding electrode; and the second current detecting unit comprises:

a second current sensor, arranged to directly sense the second sampled current flowing to the ground from the non-grounding electrode.

7. The ground-fault detecting device of claim 4, wherein the second detecting module further comprises:

a first overcurrent protecting unit, coupled to the first current detecting unit in series, for opening a connection between the first current detecting unit and the grounding electrode when the ground-fault occurs; and the third detecting module further comprises:

a second overcurrent protecting unit, coupled to the second current detecting unit in series, for opening the connection between the first current detecting unit and the non-grounding electrode when the ground-fault occurs.

8. A photovoltaic power generating system, comprising:

a photovoltaic array, arranged to converting solar energy into a DC (Direct Current) power on a DC side;

an inverter, coupled to the photovoltaic array, for converting the DC power into an AC (Alternating Current) power on an AC side;

a plurality of switches, coupled to the inverter, for selectively connecting the AC power to a grid; and a ground-fault detecting device, coupled between the AC side and a ground, for sampling a voltage of the AC power to detect if a ground-fault occurs in the AC side before the AC power is connected to the grid, wherein the ground-fault detecting device comprises:

a first detecting module, having an input terminal coupled to a specific-phase electric power of the AC power on the AC side, for sampling a voltage of the specific-phase electric power to generate a sampled voltage; and a controller, coupled to the first detecting module, for determining if a ground-fault occurs in the AC side before the AC power is connected to the grid according to the sampled voltage, wherein the first detecting module comprises:

a matching impedance device, having a first terminal coupled to the specific-phase electric power; and a grounding resistor, having a first terminal coupled to a second terminal of the matching impedance device, and a second terminal coupled to the ground;

wherein the sampled voltage is a voltage difference between the first terminal and the second terminal of the grounding resistor.

9. The photovoltaic power generating system of claim 8, wherein the controller is arranged to obtain the sampled voltage when a switch is closed, to compare the sampled voltage to a predetermined threshold voltage, and to generate an alarm signal when the sampled voltage is smaller than the predetermined threshold voltage; and wherein the sampled voltage is a voltage difference between the first terminal and the second terminal of the grounding resistor respectively.

10. The photovoltaic power generating system of claim 9, further comprising:

a second detecting module, having a first terminal coupled to a grounding electrode on the DC side, and a second terminal coupled to the ground, for generating a first sampled current; and a third detecting module, having a first terminal coupled to a non-grounding electrode on the DC side, and a second terminal coupled to the ground, for generating a second sampled current;

wherein the controller is further arranged to determine if the ground-fault occurs in the DC side before the AC power is connected to the grid and to determine if the ground-fault occurs in the DC side and the AC side when the AC power is connected to the grid according to the first sampled current and the second sampled current.

11. The photovoltaic power generating system of claim 10, wherein the second detecting module comprises:

a first controllable switch; and a first current detecting unit, coupled to the first controllable switch in series; and the third detecting module comprises:

a second controllable switch; and a second current detecting unit, coupled to the second controllable switch in series;

wherein the first current detecting unit is arranged to detect the first sampled current flowing to the ground from the grounding electrode when the first controllable switch is closed and the second controllable switch is opened;

the second current detecting unit is arranged to detect the second sampled current flowing to the ground from the non-grounding electrode when the second controllable switch is closed and the first controllable switch is opened; and the controller is further arranged to generate the alarm signal when the ground-fault occurs.

12. The photovoltaic power generating system of claim 11, wherein the alarm signal comprises a first alarm signal and a second alarm signal, and the controller comprises:

a first comparing unit, arranged to compare the first sampled current to a first predetermined threshold value, and to generate the first alarm signal for opening the first controllable switch when the first sampled current is greater than the first predetermined threshold value; and a second comparing unit, arranged to compare the second sampled current to a second predetermined threshold value, and to generate the second alarm signal for opening the second controllable switch when the second sampled current is greater than the second predetermined threshold value.

* * * * *